United States Patent
Crocco et al.

(10) Patent No.: US 10,634,396 B2
(45) Date of Patent: Apr. 28, 2020

(54) THERMOELECTRIC HEATING/COOLING DEVICES INCLUDING RESISTIVE HEATERS

(71) Applicant: LAIRD THERMAL SYSTEMS, INC., Morrisville, NC (US)

(72) Inventors: Paul Crocco, Durham, NC (US); Ramaswamy Mahadevan, Chapel Hill, NC (US); Philip A. Deane, Durham, NC (US)

(73) Assignee: LAIRD THERMAL SYSTEMS, INC., Morrisville, NC (US)

( * ) Notice: Subject to any disclaimer, the term of this patent is extended or adjusted under 35 U.S.C. 154(b) by 0 days.

(21) Appl. No.: 15/312,533

(22) PCT Filed: May 23, 2014

(86) PCT No.: PCT/US2014/039376
§ 371 (c)(1),
(2) Date: Nov. 18, 2016

(87) PCT Pub. No.: WO2015/178929
PCT Pub. Date: Nov. 26, 2015

(65) Prior Publication Data
US 2017/0211854 A1    Jul. 27, 2017

(51) Int. Cl.
*F25B 21/02*     (2006.01)
*B01L 7/00*      (2006.01)

(52) U.S. Cl.
CPC ............... *F25B 21/02* (2013.01); *B01L 7/52* (2013.01); *B01L 2300/1827* (2013.01); *F25B 2321/023* (2013.01); *F25B 2321/0212* (2013.01); *F25B 2400/01* (2013.01)

(58) Field of Classification Search
None
See application file for complete search history.

(56) References Cited

U.S. PATENT DOCUMENTS

| | | | | |
|---|---|---|---|---|
| 5,254,178 A | * | 10/1993 | Yamada | H01L 35/32 136/203 |
| 5,456,164 A | * | 10/1995 | Bang | A23B 7/04 62/3.6 |
| 5,576,512 A | * | 11/1996 | Doke | H01L 35/32 136/203 |

(Continued)

FOREIGN PATENT DOCUMENTS

EP     2 503 263 A2     9/2012

OTHER PUBLICATIONS

Supplementary European Search Report Corresponding to European Application No. 14892509.8; (4 Pages) (dated May 4, 2017).

(Continued)

*Primary Examiner* — Ibrahime A Abraham
*Assistant Examiner* — Gyounghyun Bae
(74) *Attorney, Agent, or Firm* — Myers Bigel, P.A.

(57) ABSTRACT

A thermoelectric heating/cooling device may include first and second thermally conductive headers. A plurality of thermoelectric elements thermally may be coupled in parallel between the first and second thermally conductive headers. In addition, a resistive heating element may be provided on the second header, and the second header may be between the resistive heating element and the plurality of thermoelectric elements.

21 Claims, 6 Drawing Sheets

(56) References Cited

U.S. PATENT DOCUMENTS

| | | | | |
|---|---|---|---|---|
| 5,650,904 A * | 7/1997 | Gilley | H01L 37/02 | 361/56 |
| 5,918,469 A * | 7/1999 | Cardella | H05K 7/20254 | 165/80.3 |
| 6,222,243 B1 * | 4/2001 | Kishi | H01L 35/32 | 257/467 |
| 6,326,610 B1 * | 12/2001 | Muramatsu | G01J 5/061 | 136/203 |
| 6,651,446 B1 | 11/2003 | Woods | | |
| 6,787,460 B2 * | 9/2004 | Lee | C25D 5/022 | 257/E21.175 |
| 7,834,263 B2 * | 11/2010 | DeSteese | H01L 35/34 | 136/205 |
| 8,623,687 B2 * | 1/2014 | O'Quinn | H01L 35/08 | 136/201 |
| 2002/0174660 A1 | 11/2002 | Venkatasubramanian | | |
| 2003/0099279 A1 | 5/2003 | Venkatasubramanian et al. | | |
| 2003/0113950 A1 * | 6/2003 | Cooper | H01L 35/10 | 438/54 |
| 2003/0230332 A1 | 12/2003 | Venkatasubramanian et al. | | |
| 2005/0139249 A1 * | 6/2005 | Ueki | H01L 35/32 | 136/211 |
| 2005/0255586 A1 | 11/2005 | Shin et al. | | |
| 2006/0086118 A1 * | 4/2006 | Venkatasubramanian | F25B 21/02 | 62/259.2 |
| 2006/0225773 A1 | 10/2006 | Venkatasubramanian et al. | | |
| 2006/0243317 A1 | 11/2006 | Venkatasubramanian | | |
| 2006/0289050 A1 | 12/2006 | Alley et al. | | |
| 2006/0289052 A1 | 12/2006 | O'Quinn et al. | | |
| 2007/0028956 A1 | 2/2007 | Venkatasubramanian et al. | | |
| 2007/0089773 A1 | 4/2007 | Koester et al. | | |
| 2007/0125413 A1 * | 6/2007 | Olsen | H01L 35/08 | 136/205 |
| 2007/0187815 A1 * | 8/2007 | Dai | H01L 25/167 | 257/723 |
| 2007/0215194 A1 | 9/2007 | Bharathan et al. | | |
| 2007/0277866 A1 * | 12/2007 | Sander | H01L 35/32 | 136/230 |
| 2008/0160601 A1 * | 7/2008 | Handique | B01L 3/502715 | 435/287.2 |
| 2008/0168775 A1 | 7/2008 | Windheim et al. | | |
| 2008/0185030 A1 | 8/2008 | Pierce et al. | | |
| 2008/0264464 A1 | 10/2008 | Lee et al. | | |
| 2008/0283110 A1 * | 11/2008 | Jin | H01L 35/30 | 136/206 |
| 2008/0283219 A1 * | 11/2008 | Wyatt | F28F 13/00 | 165/80.4 |
| 2009/0000652 A1 | 1/2009 | von Windheim et al. | | |
| 2009/0020148 A1 * | 1/2009 | Boukai | H01L 35/26 | 136/201 |
| 2009/0020188 A1 * | 1/2009 | Ulicny | C22F 3/00 | 148/402 |
| 2009/0072385 A1 | 3/2009 | Alley et al. | | |
| 2009/0139245 A1 * | 6/2009 | Blackway | F25B 21/02 | 62/3.62 |
| 2009/0188259 A1 | 7/2009 | Colja et al. | | |
| 2009/0205696 A1 | 8/2009 | Koester et al. | | |
| 2010/0154855 A1 * | 6/2010 | Nemir | H01L 35/30 | 136/205 |
| 2010/0252087 A1 * | 10/2010 | Deane | H01L 35/08 | 136/240 |
| 2011/0023929 A1 | 2/2011 | Edwards | | |
| 2011/0132000 A1 * | 6/2011 | Deane | F25B 21/04 | 62/3.3 |
| 2011/0162389 A1 * | 7/2011 | Bell | F02G 1/043 | 62/3.3 |
| 2011/0200501 A1 | 8/2011 | Shin et al. | | |
| 2013/0180563 A1 * | 7/2013 | Makansi | H01L 35/32 | 136/206 |
| 2013/0291920 A1 * | 11/2013 | Navone | H01L 35/32 | 136/203 |
| 2014/0194305 A1 * | 7/2014 | Kayyem | B01L 3/502715 | 506/9 |
| 2014/0305479 A1 * | 10/2014 | Nemir | H01L 35/32 | 136/203 |
| 2014/0313716 A1 * | 10/2014 | Lang | H01L 35/30 | 362/235 |
| 2014/0338715 A1 * | 11/2014 | Grunlan | H01L 35/22 | 136/205 |
| 2014/0345664 A1 * | 11/2014 | Meyer | C04B 37/021 | 136/205 |
| 2015/0083180 A1 * | 3/2015 | Lang | H01L 35/30 | 136/207 |
| 2015/0179543 A1 * | 6/2015 | Tan | H01L 23/38 | 62/3.7 |
| 2016/0035957 A1 * | 2/2016 | Casey | H01L 35/32 | 136/230 |
| 2016/0043297 A1 * | 2/2016 | Hayakawa | H01L 35/16 | 136/205 |

OTHER PUBLICATIONS

International Search Report and Written Opinion of the International Searching Authority, PCT Application No. PCT/US2014/039376, dated Sep. 25, 2014.

Chinese Office Action corresponding to Chinese Application No. 201480080715.0 (Foreign Text, 10 pages; English Translation, 5 pages) (dated Oct. 10, 2018).

* cited by examiner

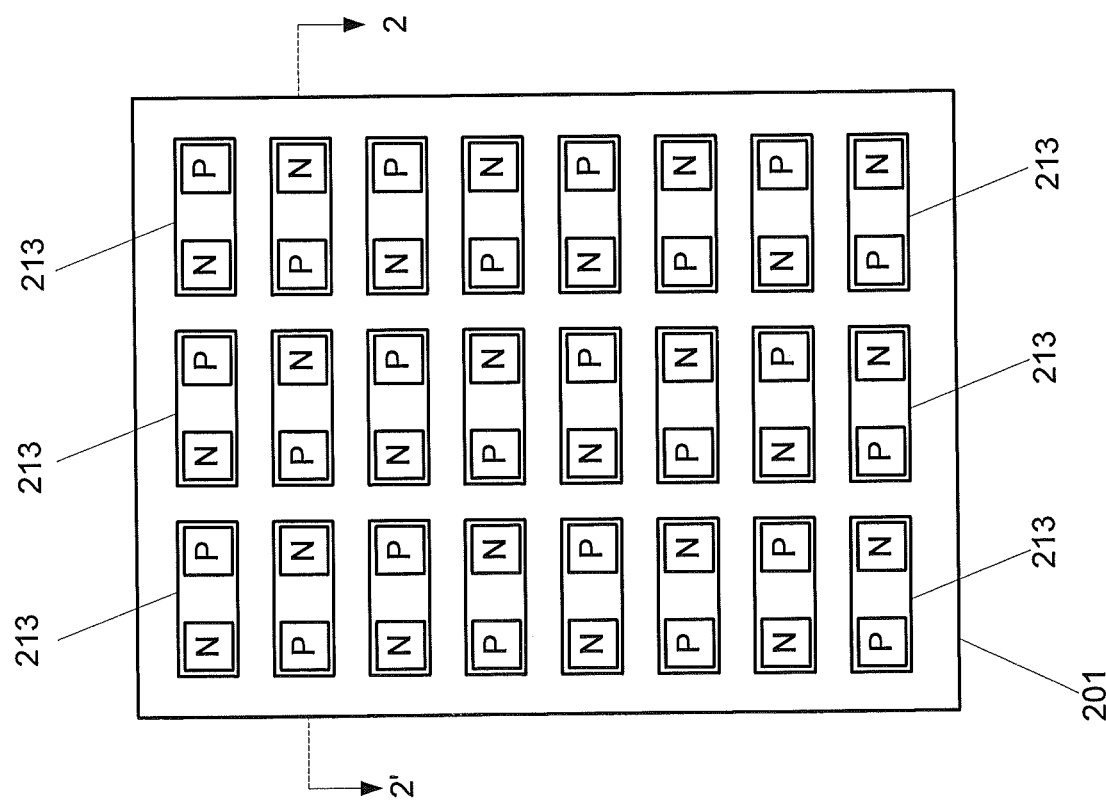

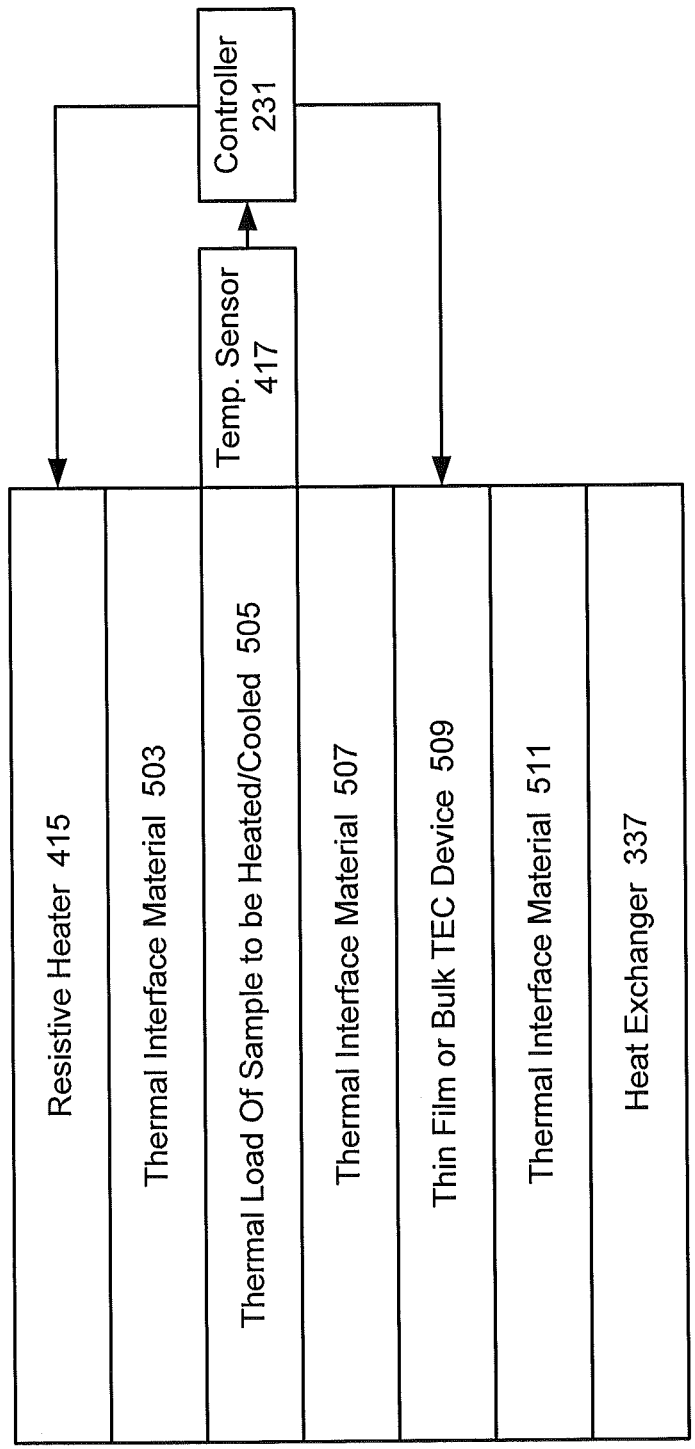

THERMOELECTRIC HEATING/COOLING DEVICES INCLUDING RESISTIVE HEATERS

CROSS REFERENCE TO RELATED APPLICATION

This application is a 35 U.S.C. § 371 national stage application of PCT International Application No. PCT/US2014/039376, filed on May 23, 2014, the disclosure and content of which is incorporated by reference herein in its entirety. The above-referenced PCT International Application was published in the English language as International Publication No. WO 2015/178929 A1 on Nov. 26, 2015.

BACKGROUND

Embodiments of present inventive concepts relate to temperature control, and more particularly, to thermoelectric temperature control devices, methods, modules, and components.

Thermoelectric materials such as p-$Bi_xSb_{2-x}Te_3$ and n-$Bi_2Te_{3-x}Se_x$ may be used to provide heat pumping (e.g., cooling and/or heating) and/or power generation according to the Peltier effect. Thermoelectric materials and structures are discussed, for example, in the reference by Venkatasubramanian et al. entitled "Phonon-Blocking Electron-Transmitting Structures" ($18^{th}$ International Conference On Thermoelectrics, 1999), the disclosure of which is hereby incorporated herein in its entirety by reference. A thermoelectric device, for example, may include one or more thermoelectric pairs with each thermoelectric pair including a p-type thermoelectric element and an n-type thermoelectric element that are electrically coupled in series and that are thermally coupled in parallel, and each of the thermoelectric elements of a pair may be formed of a thermoelectric material such as bismuth telluride (p-type or n-type $Bi_2Te_3$).

A plurality of p-type and n-type thermoelectric elements may thus be thermally coupled in parallel between first and second thermally conductive headers. The p-type and n-type thermoelectric elements may be electrically coupled in series so that an electrical current through the serially connected thermoelectric elements passes through the p-type thermoelectric elements in a first direction (e.g., in a direction from the first header toward the second header) and through the n-type thermoelectric elements in a second direction (e.g., in a direction from the second header toward the first header), with the first and second directions being opposite directions. Moreover, the directions may be reversed to reverse a direction of heat pumping. A thermoelectric control signal having a first polarity applied to the serially connected thermoelectric elements can thus be used to pump heat from the first header to the second header to heat a load coupled to the second header, and a thermoelectric control signal having a second polarity (opposite the first polarity) can be used to pump heat from the second header to the first header to cool a load coupled to the second header.

By thermally coupling such a thermoelectric component (or module) between a heat exchanger (also referred to as a heat sink) and a load, the thermoelectric component can thus be used to heat and/or to cool the load. Applications of thermoelectric heating/cooling are discussed, for example, in: U.S. Publication No. 2011/0132000 to Deane et al. entitled "Thermoelectric Heating/Cooling Structures Including a Plurality of Spaced Apart Thermoelectric Components"; U.S. Publication No. 2009/0205696 to Koester et al. entitled "Thermoelectric Heat Pumps Providing Active Thermal Barriers and Related Devices and Methods"; and U.S. Publication No. 2009/0188259 to Colja et al. entitled "Integrated Thermoelectric Cooling Element and Positive Temperature Coefficient Heater". Reliability of such thermoelectric components may be reduced, however, when the thermoelectric component is used to heat to high temperatures and/or to maintain high temperatures for an extended period.

SUMMARY

According to some embodiments of inventive concepts, a thermoelectric heating/cooling device includes a first and second thermally conductive headers, a plurality of thermoelectric elements thermally coupled in parallel between the first and second thermally conductive headers, and a resistive heating element may be on the second header. More particularly, the second header is between the resistive heating element and the plurality of thermoelectric elements.

By integrating thermoelectric heat pumping and resistive heating, a maximum/average temperature experienced by the thermoelectric elements may be reduced, and/or a maximum/average current applied to the thermoelectric elements during heating may be reduced. Accordingly, reliability of the resulting device may be improved and/or device lifetime may be increased.

The resistive heating element may include a pattern of an electrically conductive material, such as a pattern of metal, on the second header.

The second header may define a trench in a surface thereof opposite the plurality of thermoelectric elements, and at least portions of the resistive heating element may be recessed in the trench. In addition, an electrically insulating capping layer may be provided on the resistive heating element, and the resistive heating element may be between the electrically insulating capping layer and the second header. Moreover, the electrically insulating capping layer may be recessed in the trench.

A controller may be coupled to the plurality of thermoelectric elements and to the resistive heating element. The controller may be configured to apply a first thermoelectric control signal to the plurality of thermoelectric elements to pump heat from the first thermally conductive header to the second thermally conductive header while applying a resistive heater control signal to the resistive heating element to generate heat from the resistive heating element. After applying the first thermoelectric control signal and the resistive heater control signal, the controller may be further configured to apply a second thermoelectric control signal to the plurality of thermoelectric elements to pump heat from the second thermally conductive header to the first thermally conductive header. The controller may be configured to block electrical current to the resistive heating element while applying the second thermoelectric control signal to the plurality of thermoelectric elements, and/or the first and second thermoelectric control signals may have opposite polarities.

A controller may be coupled to the plurality of thermoelectric elements and to the resistive heating element. The controller may be configured to apply a first thermoelectric control signal having a first magnitude to the plurality of thermoelectric elements to pump heat from the first thermally conductive header to the second thermally conductive header while applying a resistive heater control signal to the resistive heating element to generate heat from the resistive heating element. After applying the first thermoelectric control signal, the controller may be configured to apply a second thermoelectric control signal having a second magnitude to the plurality of thermoelectric elements to continue pumping heat from the first thermally conductive header to the second thermally conductive header while continuing to apply the resistive heater control signal to the resistive heating element to generate heat from the resistive heating element. The first and second magnitudes may be different, and more particularly, the second magnitude may be greater than the first magnitude.

The first thermally conductive header may be thermally coupled to a heat exchanger. By way of example, the second thermally conductive header may be thermally coupled to a reaction vessel holder to control a polymerase chain reaction (PCR), or the second thermally conductive header may be thermally coupled to an integrated circuit device under test.

The plurality of thermoelectric elements may include p-type and n-type thermoelectric elements electrically coupled in series so that a direction of an electrical current through the p-type thermoelectric elements is opposite a direction of the electrical current through the n-type thermoelectric elements.

According to some other embodiments, a temperature control device may be configured to control a temperature of a thermal load. The temperature control device may include a thermoelectric heating/cooling element configured to provide heating/cooling of the thermal load, and a resistive heating element configured to provide heating of the thermal load.

The thermoelectric heating/cooling device may include first and second thermally conductive headers, and a plurality of thermoelectric elements thermally coupled in parallel between the first and second thermally conductive headers. The second thermally conductive header may be thermally coupled with the load, and the second thermally conductive header may be between the first thermally conductive header and the load.

The resistive heating element may be on the second header and the second header may be between the resistive heating element and the plurality of thermoelectric elements. The second header may define a trench in a surface thereof opposite the plurality of thermoelectric elements, and at least portions of the resistive heating element may be recessed in the trench. An electrically insulating capping layer may be provided on the resistive heating element, and the resistive heating element may be between the electrically insulating capping layer and the second header. In addition, the electrically insulating capping layer may be recessed in the trench. The resistive heating element may be a first resistive heating element, a second resistive heating element may be thermally coupled to the load, and the load may be thermally coupled between the first and second resistive heating elements.

The plurality of thermoelectric elements may include p-type and n-type thermoelectric elements electrically coupled in series so that a direction of an electrical current through the p-type thermoelectric elements is opposite a direction of the electrical current through the n-type thermoelectric elements.

The thermal load may be thermally coupled between the thermoelectric heating/cooling element and the resistive heating element.

The load may include a polymerase chain reaction (PCR) vessel holder thermally coupled with the thermoelectric heating/cooling element and thermally coupled with the resistive heating element.

The load may include an integrated circuit device under test. In addition, a positioning mechanism may be configured to position the thermoelectric heating/cooling element on the integrated circuit device to provide a thermal coupling between the thermoelectric heating/cooling element, and to reposition the thermoelectric heating/cooling element away from the integrated circuit device.

The positioning mechanism, for example, may include a servomechanism configured to position/reposition the thermoelectric heating/cooling element relative to the integrated circuit device using a positioning screw.

A controller may be coupled to the thermoelectric heating/cooling element and to the resistive heating element. The controller may be configured to apply a thermoelectric control signal to the thermoelectric heating/cooling element to pump heat to the load while applying a resistive heater control signal to the resistive heating element to generate heat from the resistive heating element to heat the load.

The thermoelectric control signal may include a first thermoelectric control signal, and after applying the first thermoelectric control signal and the resistive heater control signal, the controller may be further configured to apply a second thermoelectric control signal to the thermoelectric heating/cooling element to pump heat from the load.

In addition, the controller may be configured to block electrical current to the resistive heating element while applying the second thermoelectric control signal to the thermoelectric heating/cooling element, and the first and second thermoelectric control signals may have opposite polarities.

A controller may be coupled to the thermoelectric heating/cooling element and to the resistive heating element. The controller may be configured to apply a first thermoelectric control signal having a first magnitude to the thermoelectric heating/cooling element to pump heat to the load while applying a resistive heater control signal to the resistive heating element to generate heat from the resistive heating element. After applying the first thermoelectric control signal, the controller may be configured to apply a second thermoelectric control signal having a second magnitude to the thermoelectric heating/cooling element to continue pumping heat to the load while continuing to apply the resistive heater control signal to the resistive heating element to generate heat from the resistive heating element. Moreover, the first and second magnitudes may be different, and more particularly, the second magnitude may be greater than the first magnitude.

BRIEF DESCRIPTION OF THE DRAWINGS

FIG. 1C is a bottom view of the second header of FIG. 1B according to some embodiments of inventive concepts;

FIG. 5 is a cross sectional view illustrating a heating/cooling device providing both thermoelectric heat pumping and resistive heating according to some embodiments of inventive concepts.

DETAILED DESCRIPTION

Figure 1A:
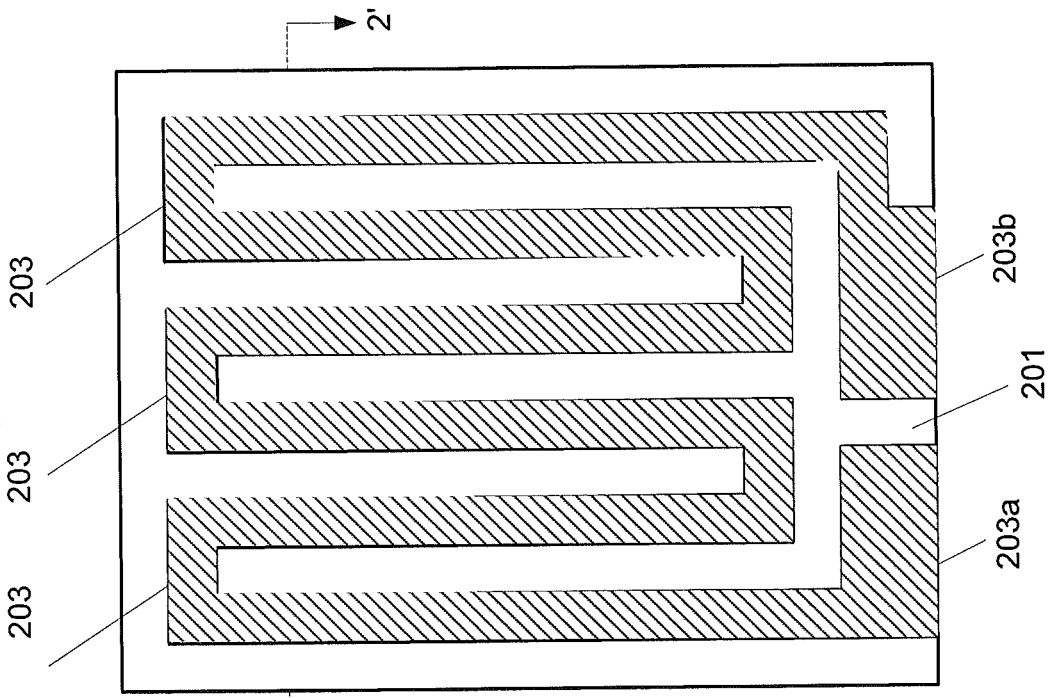
FIGS. 1A and 1B are respective top views of first and second headers of a thermoelectric heating/cooling component (also referred to as a Thermoelectric Component or TEC) according to some embodiments of inventive concepts.

Present inventive concepts are described more fully hereinafter with reference to the accompanying drawings, in which embodiments of present inventive concepts are shown. Inventive concepts may, however, be embodied in many different forms and should not be construed as limited to the embodiments set forth herein. Rather, these embodiments are provided so that this disclosure will be thorough and complete, and will fully convey the scope of present inventive concepts to those skilled in the art. In the drawings, the sizes and relative sizes of elements, layers, and regions may be exaggerated for clarity. Like numbers refer to like elements throughout.

Figure 1B:
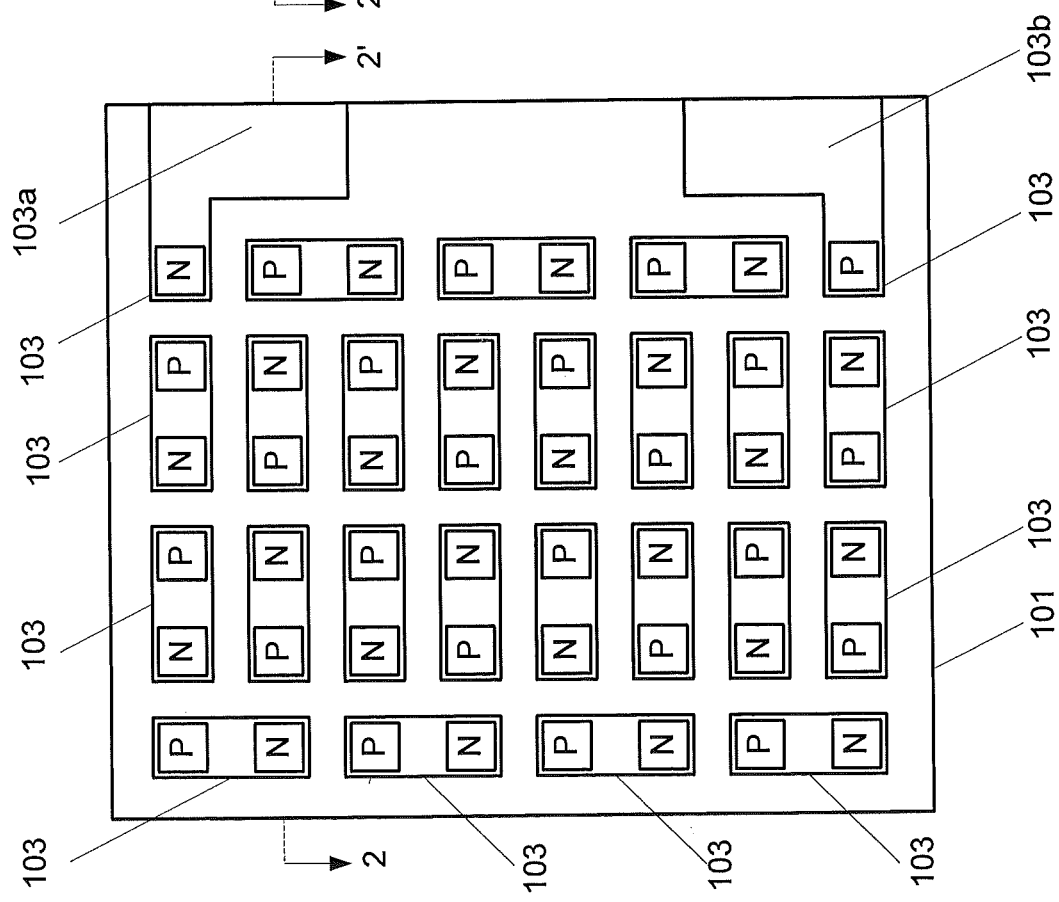
Figure 1D:
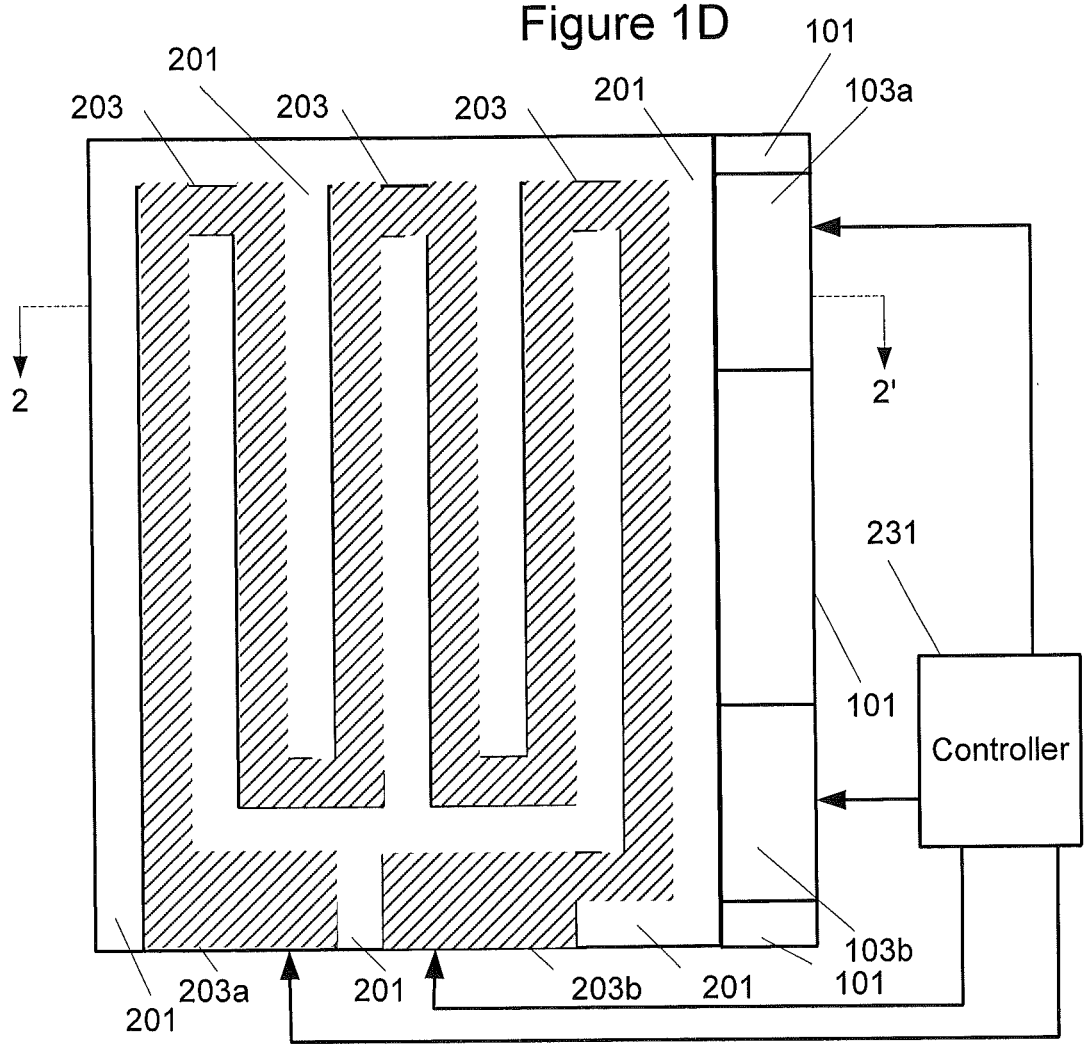
FIG. 1D is a top view of a thermoelectric heating/cooling component including the first and second headers of FIGS. 1A, 1B, and 1C according to some embodiments of inventive concepts.
Figure 2:
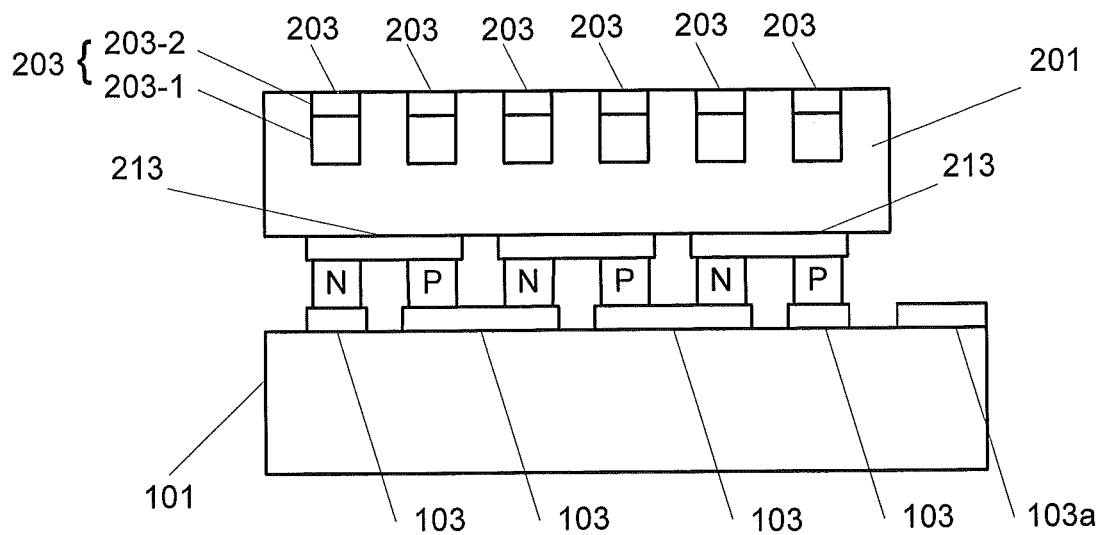
FIG. 2 is a cross sectional view of the thermoelectric heating/cooling component taken along section line 2-2' of FIG. 1D according to some embodiments of inventive concepts.

FIG. 2 is a cross sectional view of a thermoelectric heating/cooling component or TEC (also referred to as a thermoelectric module) including the bottom header of FIG. 1A, the top header of FIGS. 1B and 1C, and the thermoelectric (TE) elements P and N shown in FIGS. 1A and 1C. FIG. 1D is a top view of the thermoelectric heating/cooling component of FIG. 2 with a controller 231. Thermally conductive header 101 may include conductive traces 103 on a top surface thereof as shown in FIGS. 1A and 2, and thermally conductive header 201 may include conductive traces 213 on a bottom surface thereof as shown in FIGS. 1C and 2. More particularly, widened portions of traces 103a and 103b may provide electrical coupling to controller 231 as shown in FIG. 1D, for example, via wirebonds or other electrical interconnection.

Each of headers 101 and 201 may be thermally conductive while providing electrical isolation between traces 103/213 thereon. According to some embodiments, for example, a header may include a thermally conductive and electrically insulating substrate, such as a ceramic (e.g., aluminum oxide) substrate, with metal traces formed thereon. According to some other embodiments, a header may include a metal substrate with a thin insulating layer(s) providing electrical isolation between electrically conductive traces.

Conductive traces 103/213 may be conductive metal traces formed on the respective header 101/201. Conductive traces may be formed by depositing a thin metal layer (e.g., a copper layer) on the respective header, and patterning the metal layer, for example, using photolithography. According to some other embodiments, conductive traces may be formed using selective metal deposition.

The traces 103 and 213 may thus provide electrical coupling between p-type and n-type thermoelectric elements P and N as shown in FIGS. 1A, 1C, and 2. The thermoelectric elements P and N may thus be thermally coupled in parallel between thermally conductive headers 101 and 201, and electrically coupled in series so that a direction of an electrical current through the p-type thermoelectric element is opposite a direction of the electrical current through the n-type thermoelectric elements.

By providing a thermoelectric control signal of a first polarity (e.g., with a voltage applied to widened portion of trace 103a greater than a voltage applied to widened portion of trace 103b) from controller 231, current through p-type thermoelectric elements P may be in a first direction from header 201 to header 101, and current through n-type thermoelectric elements N may be in a second direction (opposite the first direction) from header 101 to header 201 so that heat is pumped from header 201 to header 101. By providing a thermoelectric control signal of a second polarity (e.g., with a voltage applied to widened portion of trace 103a less than a voltage applied to widened portion of trace 103b) from controller 231, current through n-type thermoelectric elements N may be in the first direction from header 201 to header 101, and current through p-type thermoelectric elements P may be in the second direction (opposite the first direction) from header 101 to header 201 so that heat is pumped from header 101 to header 201.

A direction of heat pumping can thus be determined by a polarity of a thermoelectric control signal applied to widened portions of traces 103a and 103b and the resulting current flow through the thermoelectric elements. If the top surface of header 201 is coupled to a load (e.g., an integrated circuit device under test, or a reaction vessel holder of a PCR thermocycler) and the bottom surface of header 101 is coupled to a heat exchanger, heat can be pumped from the load to the heat exchanger to cool the load (using the thermoelectric control signal of the first polarity), or heat can be pumped from the heat exchanger to the load to heat the load (using the thermoelectric control signal of the second polarity).

As further shown in FIGS. 1B, 1D, and 2, a resistive heating element 203 may be integrated on/in a top surface of header 201. Resistive heating element 203 may include a pattern of an electrically conductive material 203-1 (e.g., a pattern of a metal such as copper). As shown in FIG. 1D, widened portions 203a and 203b of resistive heating element 203 may provide electrical coupling to controller 231 as shown in FIG. 1D, for example, via wirebonds or other electrical interconnection. By providing a resistive heater control signal to widened portions 203a and 203b of resistive heating element 203, an electrical current may be generated through resistive heating element 203 to generate heat. A combination of thermoelectric heat pumping and resistive heat generation can thus be used to heat a load coupled to a top surface of header 201, and reversed thermoelectric heat pumping can be used to cool the load coupled to the top surface of header 201.

As further shown in FIG. 2, a trench (or trenches) may be defined in the top surface of header 201, and the electrically conductive material 203-1 of resistive heating element 203 may be recessed in the trench. In addition, insulating capping layer 203-2 (e.g., a thin silicon oxide layer) may be provided on the electrically conductive material 203-1. By recessing the resistive heating element 203 in the trench as shown in FIG. 2, a planar top surface of header 201 may provide improved thermal coupling with a load. Moreover, by reducing a thickness of insulating capping layer 203-2, a resistance to thermal conduction may be reduced. A resistance to thermal conduction may be further reduced by reducing a surface area occupied by the resistive heating element 203 on the top surface of header 201.

If header 201 comprises a substrate of an electrically insulating material, such as a ceramic, the electrically conductive material 203-1 may be formed directly on the header. If header 201 comprises a substrate of a metal, and thin layer of an electrically insulating material may be provided between the electrically conductive material 203-1 and header 201 to provide electrical isolation therebetween.

By providing heating using both thermoelectric heat pumping and resistive heating, higher load temperatures may be achieved, faster temperature ramp rates may be achieved, stress on thermoelectric elements may be reduced, and/or reliability of thermoelectric heat pumping (including reliability of thermoelectric elements P and N) may be increased. For example, thermoelectric heat pumping (pumping heat to the load) and resistive heating may be provided simultaneously to increase a rate of heating the load to a desired temperature and/or to increase a temperature to which the load can be heated. According to other embodiments, resistive heating can be used without thermoelectric heat pumping during an initial portion of a heat ramp to heat the load to a first temperature followed by simultaneous thermoelectric heat pumping and resistive heating to heat the load to a second temperature greater than the first temperature to reduce an amount of time that thermoelectric heat pumping is used.

According to still other embodiments, during a first portion of a temperature ramp, a first thermoelectric control signal having a first magnitude may be used to pump heat to the load while resistively generating heat responsive to a resistive heater control signal, and during a second portion of the temperature ramp after the first portion, a second thermoelectric control signal having a second magnitude greater than the first magnitude may be used to pump heat to the load while continuing to resistively generate heat responsive to continuing the resistive heater control signal. A period of time over which the second thermoelectric control signal having the greater magnitude is used may be reduced.

According to yet other embodiments, thermoelectric heat pumping may be used to provide an active thermal barrier between the load and the heat exchanger while using resistive heating to heat the load. Active thermal barriers are discussed, for example, in U.S. Publication No. 2009/0205696 to Koester et al. entitled "Thermoelectric Heat Pumps Providing Active Thermal Barriers And Related Devices And Methods," the disclosure of which is hereby incorporated herein in its entirety by reference. When using thermoelectric heat pumping to provide an active thermal barrier, thermoelectric heat pumping is used to provide thermal isolation between a load and a heat exchanger while substantially heating the load with resistive heating. A heat pumping current used to provide the active thermal barrier may thus be less than a heat pumping current used to substantially heat the load.

During active cooling, thermoelectric heat pumping (in the opposite direction) may be used to cool the load while blocking current through the resistive heating element 203.

P-type and N-type thermoelectric elements P and N may be provided using semiconductor thin-film deposition techniques, and thermoelectric structures (e.g., the structure of FIG. 2 including headers 101 and 201 and thermoelectric elements P and N) may be fabricated using micro-fabrication techniques. In such thermoelectric structures, a plurality of P and N type thermoelectric elements may be electrically coupled in series (with the series connections alternating between P-type and N-type thermoelectric elements) and thermally coupled in parallel between thermally conductive headers 101 and 201. For example, thin-films of P-type and N-type thermoelectric materials (e.g., bismuth telluride or $Bi_2Te_3$) may be epitaxially grown on respective substrates and then diced to provide substantially single crystal P-type and N-type thermoelectric elements N and P that are then soldered to respective conductive traces 103 and 213 on headers 101 and 201. In an alternative, thermoelectric elements may be provided using bulk (e.g., thicker and non-crystalline) thermoelectric materials.

By using thin-film substantially single crystal thermoelectric elements N and P, a size of a thermoelectric component may be reduced and performance may be improved. Bulk thermoelectric devices, for example, may be limited to about 10 $W/cm^2$. Use of thin-film substantially single crystal thermoelectric elements, however, may allow heat pumping capacities of 100 $W/cm^2$ or higher. Accordingly, substantially single crystal and/or thin film thermoelectric elements N and P may provide dramatically higher performance than conventional bulk thermoelectric elements, and structures of FIGS. 3A and 3B, for example, may facilitate use of such high performance thermoelectric elements in a test head requiring repeated contact with integrated circuit (IC) devices under test (DUTs) without damaging the thermoelectric elements/components.

Thermoelectric devices, structures, components, assemblies, and methods of fabrication, assembly, deposition, and/or operation thereof are discussed by way of example, in: U.S. Publication No. 2002/0174660 to Venkatasubramanian entitled "Thin-Film Thermoelectric Cooling And Heating Devices For DNA Genomic And Proteomic Chips, Thermo-Optical Switching Circuits, And IR Tags"; U.S. Publication No. 2003/0099279 to Venkatasubramanian et al. entitled "Phonon-Blocking, Electron-Transmitting Low-Dimensional Structures"; U.S. Publication No. 2003/0230332 to Venkatasubramanian et al. entitled "Thermoelectric Device Utilizing Double-Sided Peltier Junctions And Method Of Making The Device"; U.S. Publication No. 2006/0225773 to Venkatasubramanian et al. entitled "Trans-Thermoelectric Device"; U.S. Publication No. 2006/0086118 to Venkatasubramanian et al. entitled "Thin film thermoelectric devices for hot-spot thermal management in microprocessors and other electronics"; U.S. Publication No. 2006/0243317 to Venkatasubramanian entitled "Thermoelectric Generators For Solar Conversion And Related Systems And Methods"; U.S. Publication No. 2006/0289052 to O'Quinn et al. entitled "Methods Of Forming Thermoelectric Devices Including Conductive Posts And/Or Different Solder Materials And Related Methods And Structures; U.S. Publication No. 2006/0289050 to Alley et al. entitled "Methods Of Forming Thermoelectric Devices Including Electrically Insulating Matrixes Between Conductive Traces And Related Structures"; U.S. Publication No. 2007/0089773 to Koester et al. entitled "Methods Of Forming Embedded Thermoelectric Coolers With Adjacent Thermally Conductive Fields And Related Structures"; U.S. Publication No. 2007/0028956 to Venkatasubramanian et al. entitled "Methods Of Forming Thermoelectric Devices Including Superlattice Structures Of Alternating Layers With Heterogeneous Periods And Related Devices"; U.S. Publication No. 2007/0215194 to Bharathan et al. entitled "Methods Of Forming Thermoelectric Devices Using Islands Of Thermoelectric Material And Related Structures"; U.S. Publication No. 2008/0185030 to Pierce et al. entitled "Methods Of Depositing Epitaxial Thermoelectric Films Having Reduced Crack And/Or Surface Defect Densities And Related Devices"; U.S. Publication No. 2008/0168775 to Windheim et al. entitled "Temperature Control Including Integrated Thermoelectric Temperature Sensing And Related Methods And Systems"; U.S. Publication No. 2008/0264464 to Lee et al. entitled "Temperature Control Including Integrated Thermoelectric Sensing And Heat Pumping Devices And Related Methods And Systems"; U.S. Publication No. 2009/0000652 to Windheim et al. entitled "Thermoelectric Structures Including Bridging Thermoelectric Elements"; and U.S. Publication No. 2009/0072385 to Alley et al. entitled "Electronic Assemblies Providing Active Side Heat Pumping And Related Methods And Structures". The disclosures of all of the above referenced patent publications are hereby incorporated herein in their entireties by reference.

Figure 3A:
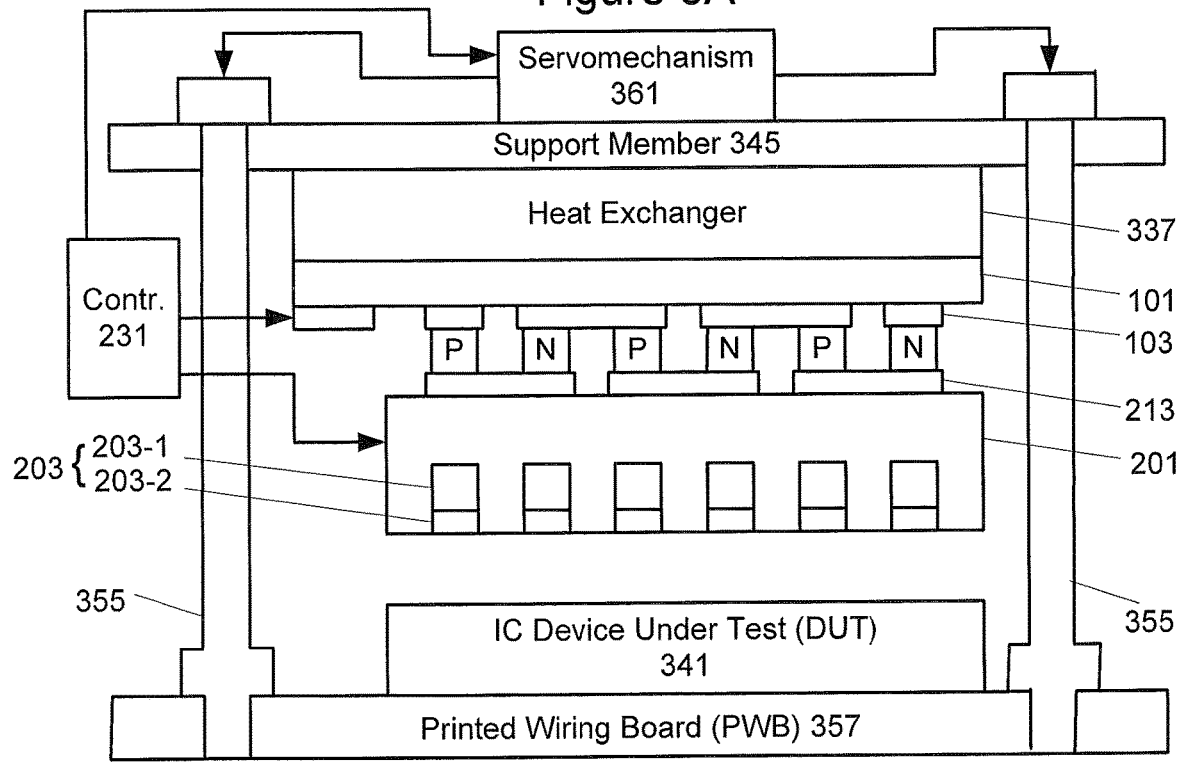
FIGS. 3A and 3B are cross sectional views of an integrated circuit test head including the thermoelectric heating/cooling component of FIG. 2 according to some embodiments of inventive concepts.
Figure 3B:
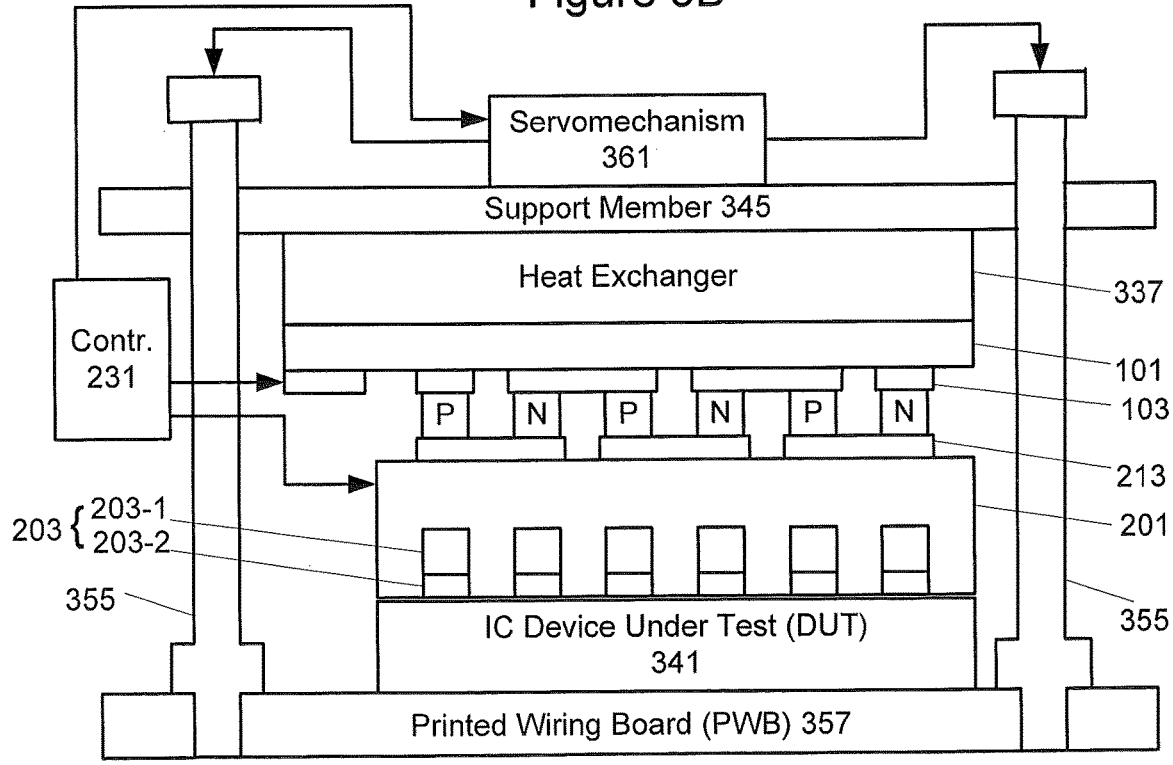

FIGS. 3A and 3B are cross sectional views illustrating a test head incorporating the thermoelectric component of FIG. 2. As shown, header 101 may be coupled to heat exchanger 337 and supported by support member 345, and servomechanism 361 and positioning screws 355 may be used to position a surface of header 201 on integrated circuit (IC) device under test (DUT) 341. Header 101 may be soldered to heat exchanger 337 to provide a thermally conductive connection/interface therebetween. According to some other embodiments, header 101 may be mechanically connected to heat exchanger 337 (e.g., using screws, bolts, etc.), with a thermal interface material or TIM (e.g., a thermally conductive grease) providing a thermally conductive interface. According to still other embodiments, a thermal adhesive may be used to provide a thermally conductive connection/interface between header 101 and heat exchanger 337. According to still other embodiments, functionality of heat exchanger 337 may be integrated in header 101 so that a separate heat exchanger is not required.

As shown in FIG. 3A, servomechanism 361 and positioning screws 355 may provide separation between header 201 and IC DUT 341 to load/unload the IC DUT 341. As shown in FIG. 3B, servomechanism 361 and positioning screws 355 may position a surface of header 201 on IC DUT 341 to provide a thermal coupling between header 201 and IC DUT 341 for electrical testing during thermocycling. Printed wiring board (PWB) 357 may provide electrical coupling with IC DUT 341 for electrical testing while subjecting the IC DUT to thermocycling. Printed wiring board 357, for example, may provide a detachable coupling with the IC DUT to allow testing of different ICs. Accordingly, printed wiring board 357 may be an element of the test head. According to some other embodiments, printed wiring board 357 and IC DUT 341 may be permanently coupled (e.g., by solder) and tested as a unit so that printed wiring board 357 is not an element of the test head.

As discussed above with respect to FIG. 1D, controller 231 may provide thermoelectric control signals to thermoelectric elements P/N to pump heat to/from the IC DUT to provide heating/cooling of the IC DUT, and controller 231 may provide resistive heater control signals to resistive heating element 203 to control heat generated by resistive heating element 203. By providing both thermoelectric heat pumping and resistive heating, control of temperature ramps may be improved, higher temperatures may be achieved, and/or reliability of the thermoelectric heat pumping elements (e.g., thermoelectric elements P/N) may be improved. Reliability of thermoelectric heat pumping elements may be improved, for example, by reducing current through the thermoelectric elements P/N, by reducing a duration that the thermoelectric elements P/N are used to pump heat at higher temperatures, and/or by reducing temperatures to which the thermoelectric elements P/N are subjected.

As shown in FIGS. 3A and 3B, resistive heating element 203 may be integrated in header 201 of the thermoelectric heat pump. According to some other embodiments, resistive heating element 203 may be provided in/on printed wiring board 357 (under IC DUT 341), and the thermoelectric heat pump may be supported by support member 345 so that the thermoelectric heat pump and the resistive heating element 203 are provided on opposite sides of IC DUT 341. In this case, resistive heating element 203 may be omitted from header 201.

According to still other embodiments, the thermoelectric heat pump (including headers and thermoelectric elements without the resistive heating element 203) may be provided in/on printed wiring board 357 (under IC DUT 341), and the resistive heating element may be supported by support member 345 so that the thermoelectric heat pump and the resistive heating element 203 are provided on opposite sides of IC DUT 341. According to yet other embodiments, resistive heating element 203 may be integrated in header 201 of the thermoelectric heat pump as shown in FIGS. 3A and 3B, and a second resistive heating element may be provided in/on printed wiring board 341 so that resistive heating may be provided on both sides of IC DUT 341. According to further embodiments, resistive heating element 203 may be integrated in header 201 of the thermoelectric heat pump as shown in FIGS. 3A and 3B, and a second thermoelectric heat pump may be provided in/on printed wiring board 341 so that thermoelectric heat pumping may be provided on both sides of IC DUT 341.

Figure 4B:
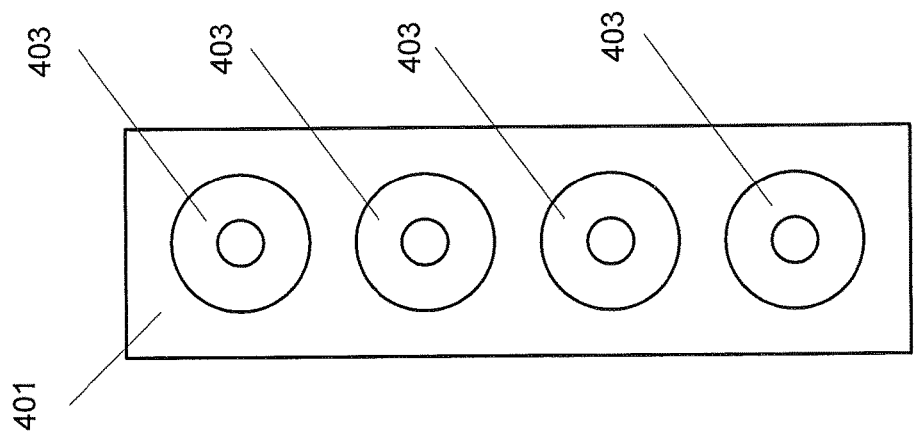
FIG. 4B is a top view of reaction vessel holder according to some embodiments of the inventive concepts.
Figure 4A:
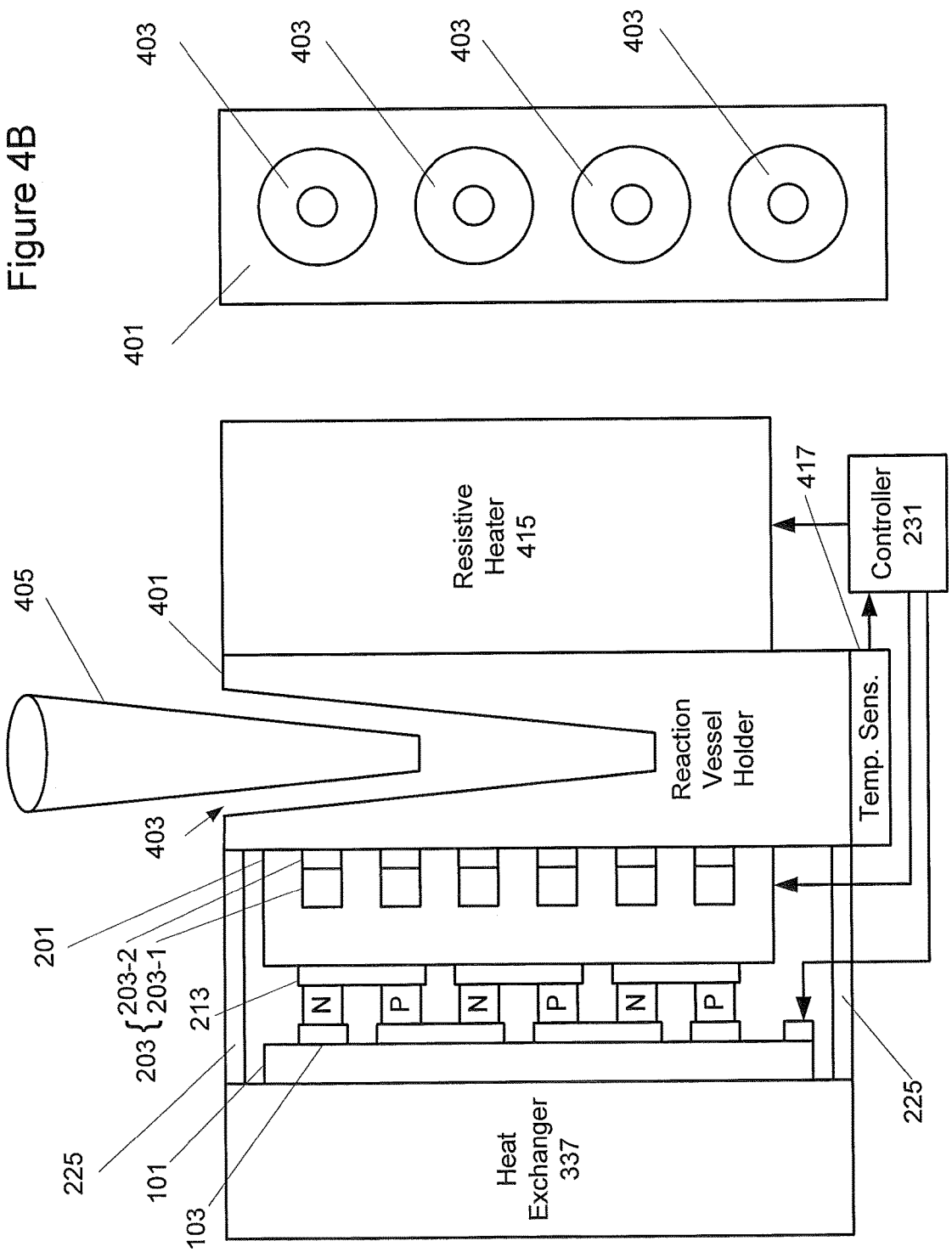
FIG. 4A is a cross sectional view of a polymerase chain reaction thermocycler including the thermoelectric heating/cooling component of FIG. 2 according to some embodiments of inventive concepts.

FIG. 4A is a cross sectional view illustrating a polymerase chain reaction (PCR) thermocycler incorporating the thermoelectric component of FIG. 2. As shown, header 101 may be thermally coupled to heat exchanger 337, and header 201 (including integrated resistive heating element 203) may be thermally coupled to reaction vessel holder 401. In addition, resistive heater 415 may be thermally coupled to reaction vessel holder 401 so that reaction vessel holder 401 is thermally coupled between resistive heater 415 and thermoelectric elements P/N. With restive heater 415, resistive heating element 203 may be omitted from header 101, or with resistive heating element 203, resistive heater 415 may be omitted. Resistive heater 415 may be provided using a structure similar to that of header 201 with resistive heating element 203 (without thermoelectric elements P/N).

As discussed above with respect to FIGS. 3A and 3B, header 101 may be soldered to heat exchanger 337 to provide a thermally conductive connection/interface therebetween. According to some other embodiments, header 101 may be mechanically connected to heat exchanger 337 (e.g., using screws, bolts, etc.), with a thermal interface material or TIM (e.g., a thermally conductive grease) providing a thermally conductive interface. According to still other embodiments, a thermal adhesive may be used to provide a thermally conductive connection/interface between header 101 and heat exchanger 337. According to still other embodiments, functionality of heat exchanger 337 may be integrated in header 101 so that a separate heat exchanger is not required. Similarly, coupling between header 201 and reaction vessel holder 401 may be provided using: solder; mechanical coupling and a thermal interface material; and/or a thermal adhesive. Also, connection between reaction vessel holder 401 and resistive heater 415 may be provided using: solder; mechanical coupling and a thermal interface material; and/or a thermal adhesive.

Reaction vessel holder 401 may be a thermally conductive block (e.g., a metal block) with one or more recesses 403 therein configured to receive a reaction vessel (or vessels) 405. FIG. 4B is a top view of reaction vessel holder 401 including four recesses 403, with each recess being configured to receive a respective reaction vessel according to some embodiments. By providing reaction vessel holder 401 as a thermally conductive block, a temperature profile of a DNA sample in a reaction vessel 405 in a respective recess 403 may be controlled using thermoelectric heat pumping and/or resistive heating.

As further shown in FIG. 4A, spacer (or spacers) 225 may be used to support heat exchanger 337 and reaction vessel holder 401 relative to each other, thereby protecting the thermoelectric component including headers 101 and 201 and thermoelectric elements P and N. A single spacer 225, for example, may seal a space between heat exchanger 337 and reaction vessel holder 401 to protect thermoelectric elements P and N from an outside environment. According to other embodiments, a plurality of separate spacers 225 may be provided. A spacer or a plurality of spacers may thus provide a rigid connection/support between heat exchanger 337 and reaction vessel holder 401 so that stress on thermoelectric elements P and N may be reduced. For example, spacers 225 may create a gap between reaction vessel holder 401 (the load) and the thermoelectric component, and the gap may be filled with a compliant material (e.g., a thermally conductive grease or other compliant and thermally conductive material).

The PCR thermocycler of FIGS. 4A and 4B is thus configured to process DNA samples in respective reaction vessels 405 according to a particular temperature profile. More particularly, controller 231 is configured to generate/apply thermoelectric control signals to thermoelectric elements P/N to provide heating and/or cooling of reaction vessel holder 401 and to generate/apply resistive heater control signals to resistive heating element 203 and/or resistive heater 415 to provide heating of reaction vessel holder 401. Moreover, temperature sensor 417 may provide temperature feedback to controller 231 to allow more precise temperature control.

In addition, temperature sensor 417 may provide temperature feedback (e.g., representing a temperature of reaction vessel holder 401) to controller 231 to facilitate more precise temperature control.

As discussed above with respect to FIG. 1D, controller 231 may provide thermoelectric control signals to thermoelectric elements P/N to pump heat to/from reaction vessel holder 401 to provide heating/cooling of the reaction vessel holder, and controller 231 may provide resistive heater control signals to resistive heating element 203 and/or to resistive heater 415 to control heat generated thereby. By providing both thermoelectric heat pumping and resistive heating, control of temperature ramps may be improved, higher temperatures may be achieved, and/or reliability of the thermoelectric heat pump may be improved. Reliability of the thermoelectric heat pump may be improved, for example, by reducing current through the thermoelectric elements P/N, by reducing a duration that the thermoelectric elements P/N are used to pump heat at higher temperatures, and/or by reducing temperatures to which the thermoelectric elements P/N are subjected.

By omitting resistive heating element 203 from header 201 and using only resistive heater 415 to provide resistive heating, reaction vessel holder 401 may separate the thermoelectric heating/cooling component (including thermoelectric elements P/N) from the resistive heating to thereby reduce a temperature to which the thermoelectric elements P/N are subjected. During heating according to some embodiments, thermoelectric heating and resistive heating may be used to increase a temperature of reaction vessel holder 401. During heating according to some other embodiments, thermoelectric heating may be used to provide an active thermal barrier between reaction vessel holder and heat exchanger 337 with actual heating being provided primarily by resistive heater 415.

In some embodiments of FIGS. 3A-B and/or 4A-B, controller 231 may be configured to apply a first thermoelectric control signal to the thermoelectric heating/cooling element (including thermoelectric elements P/N) to pump heat to reaction vessel holder while applying a resistive heater control signal to resistive heating element 203 and/or resistive heater 415 to generate heat from resistive heating element 203 and/or resistive heater 415 to heat the load. After applying the first thermoelectric control signal and the resistive heater control signal, controller 231 may be further configured to apply a second thermoelectric control signal to the thermoelectric heating/cooling element to pump heat from the load. Moreover, controller 231 may be configured to block electrical current to the resistive heating element 203 and/or resistive heater 415 while applying the second thermoelectric control signal to the thermoelectric heating/cooling element, and the first and second thermoelectric control signals may have opposite polarities. Active heating and cooling may thus be used to provide a desired temperature profile.

In some embodiments of Figured 3A-B and/or 4A-B, controller 231 may be configured to apply a first thermoelectric control signal having a first magnitude to the thermoelectric heating/cooling element to pump heat to the load while applying a resistive heater control signal to the resistive heating element 203 and/or resistive heater 415 to generate heat from the resistive heating element and/or resistive heater. After applying the first thermoelectric control signal, controller 231 may be configured to apply a second thermoelectric control signal having a second magnitude to the thermoelectric heating/cooling element to continue pumping heat to the load while continuing to apply the resistive heater control signal to resistive heating element 203 and/or resistive heater 415 to generate heat from resistive heating element 203 and/or resistive heater 415. More particularly, the first and second magnitudes of the first and second thermoelectric control signals may be different, and still more particularly, the second magnitude may be greater than the first magnitude to provide a peak temperature.

Heat exchanger 337 of FIGS. 3A, 3B, and 4A may provide a heat sink for thermoelectric pumping. For example, heat exchanger 337 may include fins to dissipate heat into the air, and/or a fan to circulate air. According to other embodiments, heat exchanger 337 may provide fluid/liquid circulation to dissipate heat into the fluid/liquid.

FIG. 5 is a cross sectional view illustrating a heating/cooling device providing both thermoelectric heat pumping and resistive heating according to some embodiments of inventive concepts. In FIG. 5, thermal load 505 is between resistive heater 415 and TEC device 509 so that the thermoelectric elements of TEC device 509 are not subjected to direct heating from resistive heater 415. Load 505 may provide a thermally resistive path between resistive heater 415 and TEC 509. This is similar to embodiments of FIG. 4A where resistive heating is provided using resistive heater 415 and resistive heating element 203 is omitted, or embodiments of FIGS. 3A-B where a resistive heater is provided under IC DUT 341 and resistive heating element 203 is omitted.

Thermal load 505, for example, may be an IC DUT 341 as discussed above with respect to FIGS. 3A-B or a reaction vessel holder 401 as discussed above with respect to FIGS. 4A-B. TEC device 509 may be implemented using headers 101/201 with traces 103/213 and thermoelectric elements P/N as discussed above with respect to FIGS. 1A-D and 2, but omitting resistive heating element 203. Resistive heater 415 may be implemented using an electrically insulating substrate and an electrically conductive pattern thereon to provide a structure as discussed above with respect to header 201 and resistive heating element 203 (without thermoelectric elements). Heat exchanger 337 may be an air or liquid cooled heat sink as discussed above.

According to some embodiments, fixed mechanical connections may be provided (e.g., using screws, bolts, etc.) between resistive heater 415, load 505, TEC device 509, and/or heat exchanger 337. In such embodiments, thermal interface material 503 may provide a thermally conductive coupling between resistive heater 415 and load 505, thermal interface material 507 may provide a thermally conductive coupling between load 505 and TEC device 509, and/or thermal interface material 511 may provide a thermally conductive coupling between TEC device 509 and heat exchanger 337. According to other embodiments, thermally conductive adhesives may provide fixed connections between resistive heater 415, load 505, TEC device 509, and/or heat exchanger 337. According to still other embodiments, solder may provide fixed connections between resistive heater 415, load 505, TEC device 509, and/or heat exchanger 337.

According to some embodiments, a temporary connection may be provided between load 505 and TEC device 509 to allow loading/unloading of the load 505 as discussed above with respect to the test head of FIGS. 3A-B. According to some other embodiments, a temporary connection may be provided between load 505 and resistive heater 415. According to still other embodiments, a surface of heat exchanger may provide a header of TEC device 509 so that heat exchanger 337 and TEC device are integrated.

In embodiments discussed above, a relatively small resistive heater (e.g., resistive heating element 203 and/or resistive heater 415) having one to two times a heating power of a maximum heat pumping capacity of a TEC (e.g., including headers 101 and 201 and thermoelectric elements P and N) may be incorporated with the TEC in the temperature control system. By providing the resistive heater and the TEC on opposite sides of the load as discussed above with respect to FIG. 5, the resistive heater and the TEC may be separated by a thermal path providing some thermal resistance to reduce a maximum/average temperature experienced by the TEC. For example, the TEC may avoid experiencing a maximum temperature of the resistive heater during a temperature ramp when the resistive heater may overshoot a target temperature to meet ramp rate requirements. The TEC can be operated in a cooling mode (pumping heat from the load to the heat exchanger) and/or at a reduced heating ramp rate so that an average temperature within the TEC does not reach a maximum temperature of the load and/or the resistive heater.

According to some embodiments of FIG. 5, heating may be provided by resistive heater 415 and cooling may be provided by TEC 509 that is at least partially thermally decoupled from resistive heater 415 by providing the load 505 (that is the subject of temperature control) between TEC 509 and resistive heater 415. By reducing average and/or maximum temperatures experienced by TEC 509, reliability of TEC 509 may be improved. According to some embodiments, TEC 509 may be run only in a cooling mode (pumping heat from load 505 to heat exchanger 337, and/or a heating mode power (when pumping heat from heat exchanger 337 to load 505) of TEC 509 may be reduced, so that an average internal temperature of TEC 509 may be reduced.

A reduction of 10 degrees C. in average temperatures experienced by TEC 505 may increase a life of TEC 505 by two or more times compared to the reliability of TEC 505 without resistive heater 415. Additional reductions in average and/or maximum temperatures experienced by TEC 505 could magnify reliability improvements, making applications with relatively long life requirements more feasible. Moreover, structures disclosed herein may improve reliability of TEC devices with bulk thermoelectric elements used in proportional-integral-derivative (PID) temperature control in both heating and cooling modes.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section without departing from the teachings of present inventive concepts.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the structure in the figures is turned over, elements described as "below" or "beneath" other elements or features would then be oriented "above" the other elements or features. Thus, the exemplary term "below" can encompass both an orientation of above and below. The structure may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of present inventive concepts. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of present inventive concepts are described herein with reference to cross-section illustrations that are schematic illustrations of idealized embodiments (and intermediate structures) of inventive concepts. As such, variations from the shapes of the illustrations as a result, for example, of manufacturing techniques and/or tolerances, are to be expected. Thus, embodiments of present inventive concepts should not be construed as limited to the particular shapes of regions illustrated herein but are to include deviations in shapes that result, for example, from manufacturing. For example, a structure illustrated with angular features may instead have rounded or curved features. Thus, the regions illustrated in the figures are schematic in nature and their shapes are not intended to illustrate the actual shape of a region of a device and are not intended to limit the scope of present inventive concepts.

Unless otherwise defined, all terms (including technical and scientific terms) used herein have the same meaning as commonly understood by one of ordinary skill in the art to which disclosed inventive concepts belong. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

While present inventive concepts have been particularly shown and described with reference to embodiments thereof, it will be understood by those of ordinary skill in the art that various changes in form and details may be made therein without departing from the spirit and scope of present inventive concepts as defined by the following claims.

That which is claimed is:

1. A thermoelectric heating/cooling device comprising:
   first and second thermally conductive headers;
   a plurality of thermoelectric elements electrically coupled by conductive traces on the first and second thermally conductive headers and thermally coupled in parallel between the first and second thermally conductive headers;
   a resistive heating element integrated in a surface of the second thermally conductive header and configured to generate resistive heat in response to a resistive heater control signal applied thereto, wherein the second thermally conductive header is between the resistive heating element and the plurality of thermoelectric elements; and
   a controller coupled to at least one of the conductive traces and to the resistive heating element, wherein the controller is configured to apply a thermoelectric control signal to the plurality of thermoelectric elements to pump heat from the first thermally conductive header to the second thermally conductive header while applying the resistive heater control signal to the resistive heating element on the second thermally conductive header.

2. The thermoelectric heating/cooling device of claim 1 wherein the resistive heating element comprises a pattern of an electrically conductive material that is integrated in the surface of the second header.

3. The thermoelectric heating/cooling device of claim 1 wherein the resistive heating element comprises a pattern of a metal that is integrated in the surface of the second header.

4. The thermoelectric heating/cooling device of claim 1 wherein the second header defines a trench in a surface thereof opposite the plurality of thermoelectric elements, and wherein at least portions of the resistive heating element are recessed in the trench.

5. The thermoelectric heating/cooling device of claim 4 further comprising:
   an electrically insulating capping layer on the resistive heating element, wherein the resistive heating element is between the electrically insulating capping layer and the second header.

6. A temperature control device configured to control a temperature of a thermal load, the temperature control device comprising:
   a thermoelectric heating/cooling element configured to provide heating/cooling of the thermal load, wherein the thermoelectric heating/cooling element comprises first and second thermally conductive headers, and a plurality of thermoelectric elements electrically connected by conductive traces on and thermally coupled in parallel between the first and second thermally conductive headers; and
   a resistive heating element integrated in a surface of the second thermally conductive header and configured to generate resistive heat in response to a resistive heater control signal applied thereto to provide heating of the thermal load, wherein the second thermally conductive header is between the resistive heating element and the plurality of thermoelectric elements; and
   a controller coupled to at least one of the conductive traces and to the resistive heating element, wherein the controller is configured to apply a thermoelectric control signal to the plurality of thermoelectric elements to pump heat from the first thermally conductive header to the second thermally conductive header while applying the resistive heater control signal to the resistive heating element on the second thermally conductive header.

7. The temperature control device of claim 6 wherein the resistive heating element is on the second header and the second header is between the resistive heating element and the plurality of thermoelectric elements.

8. The temperature control device of claim 7 wherein the second header defines a trench in a surface thereof opposite the plurality of thermoelectric elements, and wherein at least portions of the resistive heating element are recessed in the trench.

9. The temperature control device of claim 7 further comprising:
   an electrically insulating capping layer on the resistive heating element, wherein the resistive heating element is between the electrically insulating capping layer and the second header.

10. The temperature control device of claim 9 wherein the electrically insulating capping layer is recessed in the trench.

11. The temperature control device of claim 7 wherein the resistive heating element is a first resistive heating element, the temperature control device of claim 7 further comprising:
    a second resistive heating element thermally coupled to the load, wherein the load is thermally coupled between the first and second resistive heating elements.

12. The temperature control device of claim 6 wherein the plurality of thermoelectric elements comprise p-type and n-type thermoelectric elements electrically coupled in series so that a direction of an electrical current through the p-type thermoelectric elements is opposite a direction of the electrical current through the n-type thermoelectric elements.

13. The temperature control device of claim 6 wherein the thermal load is thermally coupled between the thermoelectric heating/cooling element and the resistive heating element.

14. The temperature control device of claim 6 wherein the load comprises a polymerase chain reaction (PCR) vessel holder thermally coupled with the thermoelectric heating/cooling element and thermally coupled with the resistive heating element.

15. A thermoelectric heating/cooling device comprising:
first and second thermally conductive headers;
a plurality of thermoelectric elements thermally coupled in parallel between the first and second thermally conductive headers, wherein the second thermally conductive header comprises a trench in a surface thereof opposite the plurality of thermoelectric elements;
a resistive heating element on the second thermally conductive header, wherein the resistive heating element comprises a pattern of an electrically conductive material that is recessed in the trench; and
an electrically insulating capping layer in the trench on the resistive heating element, wherein the resistive heating element is between the electrically insulating capping layer and the second thermally conductive header.

16. The thermoelectric heating/cooling device of claim 15 wherein the electrically insulating capping layer is recessed in the trench.

17. The thermoelectric heating/cooling device of claim 15 further comprising:
a controller coupled to widened portions of conductive traces electrically connecting the plurality of thermoelectric elements and to widened portions of the resistive heating element, wherein the controller is configured to apply a thermoelectric control signal to the plurality of thermoelectric elements to pump heat from the first thermally conductive header to the second thermally conductive header while applying the resistive heater control signal to the resistive heating element to generate resistive heat from the resistive heating element.

18. The thermoelectric heating/cooling device of claim 17 wherein the thermoelectric control signal comprises a first thermoelectric control signal, and wherein after applying the first thermoelectric control signal and the resistive heater control signal, the controller is further configured to apply a second thermoelectric control signal to the plurality of thermoelectric elements to pump heat from the second thermally conductive header to the first thermally conductive header.

19. The thermoelectric heating/cooling device of claim 18 wherein the controller is configured to block electrical current to the resistive heating element while applying the second thermoelectric control signal to the plurality of thermoelectric elements.

20. The thermoelectric heating/cooling device of claim 18 wherein the first and second thermoelectric control signals have opposite polarities.

21. The thermoelectric heating/cooling device of claim 15, wherein the second thermally conductive header comprises a surface having the resistive heating element integrated therein, and wherein dimensions of the resistive heating element and the electrically insulating capping layer are configured to reduce effects thereof on thermal conduction of the second thermally conductive header.

* * * * *